(12) United States Patent
Fan et al.

(10) Patent No.: US 10,546,881 B2
(45) Date of Patent: Jan. 28, 2020

(54) THIN FILM TRANSISTOR ARRAY SUBSTRATE AND DISPLAY PANEL

(71) Applicant: Shenzhen China Star Optoelectronics Semiconductor Display Technology Co., Ltd., Shenzhen (CN)

(72) Inventors: Yingchun Fan, Shenzhen (CN); Xiaoxing Zhang, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/086,017

(22) PCT Filed: Aug. 27, 2018

(86) PCT No.: PCT/CN2018/102388
§ 371 (c)(1),
(2) Date: Sep. 18, 2018

(87) PCT Pub. No.: WO2019/200805
PCT Pub. Date: Oct. 24, 2019

(65) Prior Publication Data
US 2019/0326325 A1    Oct. 24, 2019

(51) Int. Cl.
| | |
|---|---|
| H01L 21/00 | (2006.01) |
| H01L 27/12 | (2006.01) |
| H01L 27/32 | (2006.01) |
| G02F 1/1335 | (2006.01) |
| G02F 1/1368 | (2006.01) |
| G02F 1/1362 | (2006.01) |

(52) U.S. Cl.
CPC ......... *H01L 27/124* (2013.01); *G02F 1/1368* (2013.01); *G02F 1/133512* (2013.01); *G02F 1/136209* (2013.01); *G02F 1/136286* (2013.01); *H01L 27/1225* (2013.01); *H01L 27/3262* (2013.01)

(58) Field of Classification Search
CPC ............ H01L 27/124; G02F 1/136209; G02F 1/136286
See application file for complete search history.

(56) References Cited

U.S. PATENT DOCUMENTS 9,443,920 B2 * 9/2016 Noh .................... H01L 27/3272
2007/0159565 A1   7/2007 Segawa et al.
(Continued)

FOREIGN PATENT DOCUMENTS

CN    101000914    7/2007
CN    107154419    9/2017

*Primary Examiner* — Laura M Menz

(57) ABSTRACT

A thin film transistor array substrate and a display panel are provided. The thin film transistor array substrate includes a substrate, a thin film transistor, a scan line, a data line and a pixel electrode. The thin film transistor includes a semiconductor member, a gate electrode, a source electrode and a drain electrode. The source electrode and the drain electrode include a first extension portion and a second extension portion, respectively. The first extension portion and the second extension portion are configured to block light that is emitted toward an electron migration channel of the thin film transistor. Thus, external light emitting toward the electron migration channel can be prevented.

18 Claims, 2 Drawing Sheets

(56) References Cited

U.S. PATENT DOCUMENTS

| | | | |
|---|---|---|---|
| 2011/0031491 A1* | 2/2011 | Yamazaki | G02F 1/136227 257/43 |
| 2012/0075270 A1* | 3/2012 | Kitakado | G02F 1/133512 345/204 |
| 2015/0060814 A1* | 3/2015 | Noh | H01L 27/3272 257/40 |
| 2017/0155000 A1* | 6/2017 | Moon | H01L 29/78606 |
| 2018/0061927 A1* | 3/2018 | Jeong | H01L 29/78648 |
| 2018/0175077 A1* | 6/2018 | Koo | H01L 27/3272 |
| 2019/0140038 A1* | 5/2019 | Lee | H01L 27/3253 |
| 2019/0189723 A1* | 6/2019 | Kim | H01L 27/3262 |

* cited by examiner

THIN FILM TRANSISTOR ARRAY SUBSTRATE AND DISPLAY PANEL

RELATED APPLICATIONS

This application is a National Phase of PCT Patent Application No. PCT/CN2018/102388 having International filing date of Aug. 27, 2018, which claims the benefit of priority of Chinese Patent Application No. 201810356275.7 filed on Apr. 19, 2018. The contents of the above applications are all incorporated by reference as if fully set forth herein in their entirety.

FIELD AND BACKGROUND OF INVENTION

This disclosure relates to display technology, and more particularly to a thin film transistor array substrate and display panel.

Conventional thin film transistor array substrates include thin film transistors. Structure of the thin film transistors employs a top gate structure. Semiconductor members of the thin film transistor are made of amorphous indium gallium zinc oxide.

Conventional thin film transistors using the top gate structure made of amorphous indium gallium zinc oxide are more sensitive to light. When an electron migration channel of the thin film transistor in the conventional thin film transistor array substrates is exposed to light, stability of the thin film transistor will be affected.

Thus, it is necessary to provide a novel technical solution to solve current technical problems.

SUMMARY OF INVENTION

The object of this disclosure is to provide a thin film transistor array substrate and a display panel for preventing external light from emitting toward an electron migration channel of a thin film transistor.

In order to solve the above-mentioned drawbacks, the technical solutions provided by the disclosure are as follows.

This disclosure provides a thin film transistor array substrate, which comprises a substrate, a thin film transistor, a scan line, a data line and a pixel electrode. The thin film transistor comprises a semiconductor member, a gate electrode, a source electrode and a drain electrode. The thin film transistor further comprises a light shielding member disposed on the substrate, a buffer layer disposed on the substrate and the light shielding member, a first insulating layer disposed between the gate electrode and the semiconductor member, and a second insulating layer covering at least a portion of the buffer layer, the semiconductor member, the first insulating layer, and the gate electrode. At least a portion of the source electrode and at least a portion of the drain electrode are disposed on the second insulating layer, the source electrode is connected to a first contact portion of the semiconductor member through penetrating a first through hole of the second insulating layer, and the drain electrode is connected to a second contact portion of the semiconductor member through penetrating a second through hole of the second insulating layer. A portion of the source electrode disposed on the second insulating layer comprises a first extension portion, a portion of the drain electrode disposed on the second insulating layer comprises a second extension portion, and both of the first extension portion and the second extension portion are configured to block external light that is emitted from an outside of the thin film transistor array substrate to an electron migration channel of the thin film transistor. The first extension portion extends from a body of the source electrode toward the drain electrode. A first projection of the first extension portion projected on a plane where the thin film transistor array substrate is located overlaps a second projection projected on a plane, where the thin film transistor array substrate is located, of a first gap between the body of the source electrode and the gate electrode. The second extension portion extends from a body of the drain electrode toward the source electrode. A third projection of the second extension portion projected on a plane where the thin film transistor array substrate is located overlaps a fourth projection projected on a plane, where the thin film transistor array substrate is located, of a second gap between the body of the drain electrode and the gate electrode.

In the disclosure of the thin film transistor array substrate, both of the first extension portion and the second extension portion are made of opaque metal.

This disclosure further provides a thin film transistor array substrate, the thin film transistor array substrate comprises a substrate, a thin film transistor, a scan line, a data line and a pixel electrode. The thin film transistor comprises a semiconductor member, a gate electrode, a source electrode and a drain electrode. The thin film transistor further comprises a light shielding member disposed on the substrate, a buffer layer disposed on the substrate and the light shielding member, a first insulating layer disposed between the gate electrode and the semiconductor member, and a second insulating layer covering at least a portion of the buffer layer, the semiconductor member, the first insulating layer, and the gate electrode. At least a portion of the source electrode and at least a portion of the drain electrode are disposed on the second insulating layer, the source electrode is connected to a first contact portion of the semiconductor member through penetrating a first through hole of the second insulating layer, and the drain electrode is connected to a second contact portion of the semiconductor member through penetrating a second through hole of the second insulating layer. A portion of the source electrode disposed on the second insulating layer comprises a first extension portion, a portion of the drain electrode disposed on the second insulating layer comprises a second extension portion, and both of the first extension portion and the second extension portion are configured to block external light that is emitted from an outside of the thin film transistor array substrate to an electron migration channel of the thin film transistor.

In the disclosure of the thin film transistor array substrate, the first extension portion extends from a body of the source electrode toward the drain electrode.

In the disclosure of the thin film transistor array substrate, first projection of the first extension portion projected on a plane where the thin film transistor array substrate is located overlaps a second projection projected on a plane, where the thin film transistor array substrate is located, of a first gap between the body of the source electrode and the gate electrode.

In the disclosure of the thin film transistor array substrate, the second extension portion extends from a body of the drain electrode toward the source electrode.

In the disclosure of the thin film transistor array substrate, a third projection of the second extension portion projected on a plane where the thin film transistor array substrate is located overlaps a fourth projection projected on a plane, where the thin film transistor array substrate is located, of a second gap between the body of the drain electrode and the gate electrode.

In the disclosure of the thin film transistor array substrate, both of the first extension portion and the second extension portion are made of opaque metal.

In the disclosure of the thin film transistor array substrate, when both of the source electrode and the drain electrode are made of a light-permeable metal, a first light shielding sheet made of an opaque metal is disposed at a position on the second insulating layer and corresponding to the first extension portion, and a second light shielding sheet made of an opaque metal is disposed at a position on the second insulating layer and corresponding to the first extension portion.

In the disclosure of the thin film transistor array substrate, the first light shielding sheet is disposed between the first extension portion and the second insulating layer, or the first light shielding sheet is disposed on a surface of the first extension portion facing away from the second insulating layer, and the second light shielding sheet is disposed between the second extension portion and the second insulating layer, or the second light shielding sheet is disposed on a surface of the second extension portion facing away from the second insulating layer.

In the disclosure of the thin film transistor array substrate, both of the first light shielding sheet and the second light shielding sheet are configured to block light that is emitted from the outside of the thin film transistor array substrate to the electron migration channel of the thin film transistor.

This disclosure further provides a display panel, comprising a thin film transistor array substrate and a display device. The display device is laminated and combined with the thin film transistor array substrate. The thin film transistor array substrate comprises a substrate, a thin film transistor, a scan line, a data line and a pixel electrode. The thin film transistor comprises a semiconductor member, a gate electrode, a source electrode and a drain electrode. The thin film transistor further comprises a light shielding member disposed on the substrate, a buffer layer disposed on the substrate and the light shielding member, a first insulating layer disposed between the gate electrode and the semiconductor member, and a second insulating layer covering at least a portion of the buffer layer, the semiconductor member, the first insulating layer, and the gate electrode. At least a portion of the source electrode and at least a portion of the drain electrode are disposed on the second insulating layer, the source electrode is connected to a first contact portion of the semiconductor member through penetrating a first through hole of the second insulating layer, and the drain electrode is connected to a second contact portion of the semiconductor member through penetrating a second through hole of the second insulating layer. A portion of the source electrode disposed on the second insulating layer comprises a first extension portion, a portion of the drain electrode disposed on the second insulating layer comprises a second extension portion, and both of the first extension portion and the second extension portion are configured to block external light that is emitted from an outside of the thin film transistor array substrate to an electron migration channel of the thin film transistor.

In the disclosure of the display panel, the first extension portion extends from a body of the source electrode toward the drain electrode.

In the disclosure of the display panel, a first projection of the first extension portion projected on a plane where the thin film transistor array substrate is located overlaps a second projection projected on a plane, where the thin film transistor array substrate is located, of a first gap between the body of the source electrode and the gate electrode.

In the disclosure of the display panel, the second extension portion extends from a body of the drain electrode toward the source electrode.

In the disclosure of the display panel, a third projection of the second extension portion projected on a plane where the thin film transistor array substrate is located overlaps a fourth projection projected on a plane, where the thin film transistor array substrate is located, of a second gap between the body of the drain electrode and the gate electrode.

In the disclosure of the display panel, both of the first extension portion and the second extension portion are made of opaque metal.

In the disclosure of the display panel, both of the source electrode and the drain electrode are made of a light-permeable metal, a first light shielding sheet made of an opaque metal is disposed at a position on the second insulating layer and corresponding to the first extension portion, and a second light shielding sheet made of an opaque metal is disposed at a position on the second insulating layer and corresponding to the first extension portion.

In the disclosure of the display panel, the first light shielding sheet is disposed between the first extension portion and the second insulating layer, or the first light shielding sheet is disposed on a surface of the first extension portion facing away from the second insulating layer, and the second light shielding sheet is disposed between the second extension portion and the second insulating layer, or the second light shielding sheet is disposed on a surface of the second extension portion facing away from the second insulating layer.

In the disclosure of the display panel, both of the first light shielding sheet and the second light shielding sheet are configured to block external light that is emitted from the outside of the thin film transistor array substrate to the electron migration channel of the thin film transistor.

Advantageous effects of the disclosure are as follows. Compared to the conventional technology, due to a first extension portion is disposed on a portion where the source electrode is disposed on the second insulating layer, and a second extension portion is disposed on a portion where the drain electrode is disposed on the second insulating layer, and both of the first extension portion and the second extension portion are configured to block external light that is emitted from an outside of the thin film transistor array substrate to an electron migration channel of the thin film transistor. Therefore, external light emitting toward an electron migration channel of a thin film transistor can be prevented and a stability of the thin film transistor can be maintained.

In order to more clearly describe the embodiments of the disclosure, the description is used to make a simple introduction of the drawings used in the following embodiments.

DETAILED DESCRIPTION OF SPECIFIC EMBODIMENTS OF THE INVENTION

The term "embodiment" used in this disclosure means an example, an instance, or an illustration. In addition, the term s "a" and "an" as used in this disclosure and the claims could generally be construed to mean "one or more" unless specified otherwise or clear from the disclosure.

A display panel of the disclosure can be a thin film transistor liquid crystal display (TFT-LCD), an organic light emitting diode (OLED), or the like.

The display panel of the disclosure comprises a thin film transistor array substrate 101 and a display device. The display device are laminated and combined with the thin film transistor array substrate integrally.

Figure 1:
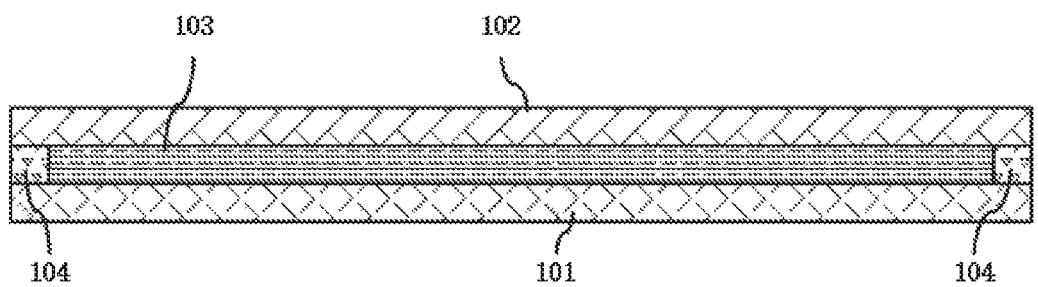
FIG. 1 is a schematic view of a display panel of the disclosure.

Referring to FIG. 1, when the display panel is a TFT-LCD, the display device includes a color film substrate 102, a liquid crystal layer 103, and a sealing member 104. The liquid crystal layer 103 and the sealing member 104 are disposed between the thin film transistor array substrate 101 and the color filter substrate 102.

As the display panel is an OLED, the display device includes an electron transport layer, an organic light emitting material layer, a hole transport layer, a cathode layer, and the like. The electron transport layer, the organic light emitting material layer, and the hole transport layer are provided between the cathode layer and the thin film transistor array substrate 101.

Figure 2:
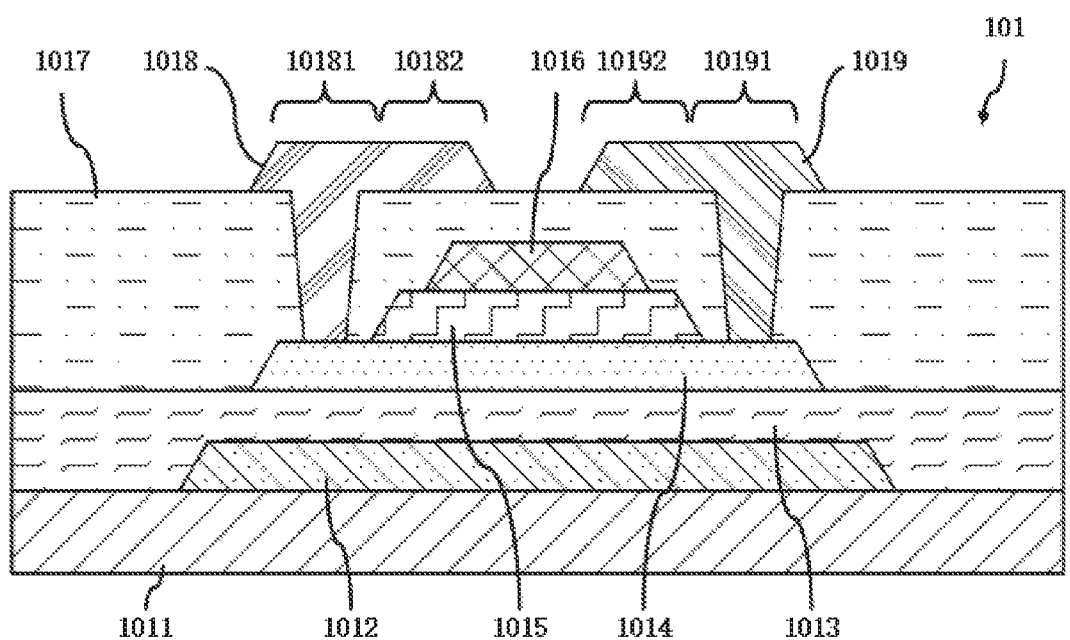
FIG. 2 a schematic view of a thin film transistor array substrate in the display panel according to FIG. 1 of this disclosure.

As shown in FIG. 2, the thin film transistor array substrate 101 comprises a substrate 1011, a thin film transistor, a scan line, a data line and a pixel electrode. The thin film transistor comprises a semiconductor member 1014, a gate electrode 1016, a source electrode 1018 and a drain electrode 1019. The gate electrode 1016 is connected to the scan line, the source electrode 1018 is connected to the data line, and the drain electrode 1019 is connected to the pixel electrode.

The thin film transistor further comprises a light shielding member 1012, a buffer layer 1013, a first insulating layer 1015 and a second insulating layer 1017.

The light shielding member 1012 is disposed on the substrate 1011.

The buffer layer 1013 is disposed on the substrate 1011 and the light shielding member 1012. Specifically, the buffer layer 1013 covers the light shielding member 1012.

A structure of the thin film transistor is a top gate structure. The semiconductor member 1014 of the thin film transistor is disposed on the buffer layer 1013. A material of the semiconductor member 1014 is, for example, a-IGZO (amorphous indium gallium zinc oxide).

The first insulating layer 1015 is disposed between the gate electrode 1016 and the semiconductor member 1014 of the thin film transistor. The first insulating layer 1015 is disposed on the semiconductor member 1014, and the gate electrode 1016 is disposed on the first insulating layer 1015.

The second insulating layer 1017 covers at least a portion of the buffer layer 1013, the semiconductor member 1014, the first insulating layer 1015, and the gate electrode 1016.

At least a portion of the source electrode 1018 and at least a portion of the drain electrode 1019 are disposed on the second insulating layer 1017, the source electrode 1018 is connected to an end portion (a first contact portion) of the semiconductor member 1014 through penetrating a first through hole of the second insulating layer 1017, and the drain electrode 1019 is connected to the other end portion (a second contact portion) of the semiconductor member 1014 through penetrating a second through hole of the second insulating layer 1017.

A portion of the source electrode 1018 disposed on the second insulating layer 1017 comprises a first extension portion 10182, a portion of the drain electrode 1019 disposed on the second insulating layer 1017 comprises a second extension portion 10192, and both of the first extension portion 10182 and the second extension portion 10192 are configured to block external light that is emitted from an outside of the thin film transistor array substrate 101 to an electron migration channel of the thin film transistor.

A position of the first through hole in the second insulating layer 1017 corresponds to a position of the first contact portion of the semiconductor member 1014. A position of the second through hole in the second insulating layer 1017 corresponds to a position of the second contact portion of the semiconductor member 1014.

The first extension portion 10182 extends from a body 10181 of the source electrode 1018 toward the drain electrode 1019.

A first projection of the first extension portion 10182 projected on a plane where the thin film transistor array substrate 101 is located overlaps a second projection projected on a plane, where the thin film transistor array substrate 101 is located, of a first gap between the body 10181 of the source electrode 1018 and the gate electrode 1019.

The second extension portion 10192 extends from a body 10191 of the drain electrode 1019 toward the source electrode 1018.

A third projection of the second extension portion 10192 projected on a plane where the thin film transistor array substrate 101 is located overlaps a fourth projection projected on a plane, where the thin film transistor array substrate 101 is located, of a second gap between the body 10191 of the drain electrode 1019 and the gate electrode 1016.

As an improvement, both of the first extension portion 10182 and the second extension portion 10192 are made of opaque metal.

Alternatively, when both of the source electrode 1018 and the drain electrode 1019 are made of a light-permeable metal, a first light shielding sheet made of an opaque metal is disposed at a position on the second insulating layer and corresponding to the first extension portion 10182, and a second light shielding sheet made of an opaque metal is disposed at a position on the second insulating layer 1017 and corresponding to the first extension portion 10182.

The first light shielding sheet is disposed between the first extension portion 10182 and the second insulating layer 1017, or the first light shielding sheet is disposed on a surface of the first extension portion 10182 facing away from the second insulating layer 1017.

The second light shielding sheet is disposed between the second extension portion 10192 and the second insulating layer 1017, or the second light shielding sheet is disposed on a surface of the second extension portion 10182 facing away from the second insulating layer 1017.

Both of the first light shielding sheet and the second light shielding sheet are configured to block external light that is emitted from the outside of the thin film transistor array substrate 101 to the electron migration channel of the thin film transistor.

As an improvement, a first light shielding block and a second light shielding block are disposed on both sides of the gate electrode 1016. The first light shielding block is disposed at a side of the gate electrode 1016 facing the source electrode 1018. The second light shielding block is disposed at the side of the gate electrode 1016 facing the drain electrode 1019.

In a direction perpendicular to a plane where the thin film transistor array substrate 101 is located, the first light shielding block is located below the first extension portion 10182, and the second light shielding block is located below the second extension portion 10192.

The first extension portion 10182 and the first light shielding block are formed in a staggered stacking state, and the second extension portion 10192 and the second light shielding block are formed in a staggered stacking state.

The first extension portion 10182 and the first light shielding block are used to jointly block external light that is emitted from the outside of the thin film transistor array substrate 101 to the electron migration channel of the thin film transistor.

The second extension portion 10192 and the second light shielding block are used to jointly block external light that is emitted from the outside of the thin film transistor array substrate 101 to the electron migration channel of the thin film transistor.

The first light shielding block and the second light shielding block are both formed of an insulating material. The first light shielding block and the second light shielding block are used to jointly block external light that is emitted from the outside of the thin film transistor array substrate 101 to the electron migration channel of the thin film transistor. In addition, the first light shielding block made of the insulating material is also used to prevent the gate electrode 1016 from forming a parasitic capacitance with the first extension portion 10182 and/or the first light shielding sheet, and the second light shielding block made of the insulating material is also used to prevent the gate electrode 1016 from forming a parasitic capacitance with the second extension portion 10192 and/or the second light shielding sheet.

An overlap area of the gate electrode 1016 and the first extension portion 10182 and/or the first light shielding sheet in a direction perpendicular to a plane where the thin film transistor array substrate 101 is located is zero. An overlap area of the gate electrode 1016 and the second extension portion 10192 and/or the second light shielding sheet in a direction perpendicular to a plane where the thin film transistor array substrate 101 is located is zero.

Compared to the conventional technology, due to the first extension portion 18182 is disposed on a portion where the source electrode 1018 is disposed on the second insulating layer 1017, and a second extension portion 10192 is disposed on a portion where the drain electrode 1019 is disposed on the second insulating layer 1017, and both of the first extension portion 10182 and the second extension portion 10192 are configured to block external light that is emitted from an outside of the thin film transistor array substrate to an electron migration channel of the thin film transistor. Therefore, external light emitting toward an electron migration channel of a thin film transistor can be prevented and a stability of the thin film transistor can be maintained.

This disclosure has been described with preferred embodiments thereof, and it is understood that many changes and modifications to the described embodiment can be carried out without departing from the scope and the spirit of the disclosure that is intended to be limited only by the appended claims.

What is claimed is:

1. A thin film transistor array substrate, comprising a substrate, a thin film transistor, a scan line, a data line and a pixel electrode, wherein the thin film transistor comprises a semiconductor member, a gate electrode, a source electrode, and a drain electrode;
    the thin film transistor further comprising:
    a light shielding member disposed on the substrate;
    a buffer layer disposed on the substrate and the light shielding member;
    a first insulating layer disposed between the gate electrode and the semiconductor member; and
    a second insulating layer covering at least a portion of the buffer layer, the semiconductor member, the first insulating layer, and the gate electrode;
    wherein at least a portion of the source electrode and at least a portion of the drain electrode are disposed on the second insulating layer, the source electrode is connected to a first contact portion of the semiconductor member through penetrating a first through hole of the second insulating layer, and the drain electrode is connected to a second contact portion of the semiconductor member through penetrating a second through hole of the second insulating layer;
    wherein a portion of the source electrode disposed on the second insulating layer comprises a first extension portion, a portion of the drain electrode disposed on the second insulating layer comprises a second extension portion, and both of the first extension portion and the second extension portion are configured to block external light that is emitted from an outside of the thin film transistor array substrate to an electron migration channel of the thin film transistor;
    wherein the first extension portion extends from a body of the source electrode toward the drain electrode;
    wherein a first projection of the first extension portion projected on a plane where the thin film transistor array substrate is located overlaps a second projection projected on a plane, where the thin film transistor array substrate is located, of a first gap between the body of the source electrode and the gate electrode;
    wherein the second extension portion extends from a body of the drain electrode toward the source electrode; and
    wherein a third projection of the second extension portion projected on a plane where the thin film transistor array substrate is located overlaps a fourth projection projected on a plane, where the thin film transistor array substrate is located, of a second gap between the body of the drain electrode and the gate electrode;
    wherein when both of the source electrode and the drain electrode are made of a light-permeable metal, a first light shielding sheet made of an opaque metal is disposed at a position on the second insulating layer and corresponding to the first extension portion, and a second light shielding sheet made of an opaque metal is disposed at a position on the second insulating layer and corresponding to the first extension portion.

2. The thin film transistor array substrate according to claim 1, wherein both of the first extension portion and the second extension portion are made of opaque metal.

3. A thin film transistor array substrate, the thin film transistor array substrate comprising a substrate, a thin film transistor, a scan line, a data line and a pixel electrode, wherein the thin film transistor comprises a semiconductor member, a gate electrode, a source electrode and a drain electrode;
    the thin film transistor further comprising:
    a light shielding member disposed on the substrate;
    a buffer layer disposed on the substrate and the light shielding member;
    a first insulating layer disposed between the gate electrode and the semiconductor member; and
    a second insulating layer covering at least a portion of the buffer layer, the semiconductor member, the first insulating layer, and the gate electrode;

wherein at least a portion of the source electrode and at least a portion of the drain electrode are disposed on the second insulating layer, the source electrode is connected to a first contact portion of the semiconductor member through penetrating a first through hole of the second insulating layer, and the drain electrode is connected to a second contact portion of the semiconductor member through penetrating a second through hole of the second insulating layer; and wherein a portion of the source electrode disposed on the second insulating layer comprises a first extension portion, a portion of the drain electrode disposed on the second insulating layer comprises a second extension portion, and both of the first extension portion and the second extension portion are configured to block external light that is emitted from an outside of the thin film transistor array substrate to an electron migration channel of the thin film transistor;

wherein when both of the source electrode and the drain electrode are made of a light-permeable metal, a first light shielding sheet made of an opaque metal is disposed at a position on the second insulating layer and corresponding to the first extension portion, and a second light shielding sheet made of an opaque metal is disposed at a position on the second insulating layer and corresponding to the first extension portion.

4. The thin film transistor array substrate according to claim 3, wherein the first extension portion extends from a body of the source electrode toward the drain electrode.

5. The thin film transistor array substrate according to claim 3, wherein a first projection of the first extension portion projected on a plane where the thin film transistor array substrate is located overlaps a second projection projected on a plane, where the thin film transistor array substrate is located, of a first gap between the body of the source electrode and the gate electrode.

6. The thin film transistor array substrate according to claim 3, wherein the second extension portion extends from a body of the drain electrode toward the source electrode.

7. The thin film transistor array substrate according to claim 3, wherein a third projection of the second extension portion projected on a plane where the thin film transistor array substrate is located overlaps a fourth projection projected on a plane, where the thin film transistor array substrate is located, of a second gap between the body of the drain electrode and the gate electrode.

8. The thin film transistor array substrate according to claim 3, wherein both of the first extension portion and the second extension portion are made of opaque metal.

9. The thin film transistor array substrate according to claim 3, wherein the first light shielding sheet is disposed between the first extension portion and the second insulating layer, or the first light shielding sheet is disposed on a surface of the first extension portion facing away from the second insulating layer; and the second light shielding sheet is disposed between the second extension portion and the second insulating layer, or the second light shielding sheet is disposed on a surface of the second extension portion facing away from the second insulating layer.

10. The thin film transistor array substrate according to claim 3, wherein both of the first light shielding sheet and the second light shielding sheet are configured to block external light that is emitted from the outside of the thin film transistor array substrate to the electron migration channel of the thin film transistor.

11. A display panel, comprising a thin film transistor array substrate and a display device, the display device laminated and combined with the thin film transistor array substrate, the thin film transistor array substrate comprising a substrate, a thin film transistor, a scan line, a data line and a pixel electrode, wherein the thin film transistor comprises a semiconductor member, a gate electrode, a source electrode and a drain electrode;

the thin film transistor further comprising:
a light shielding member disposed on the substrate;
a buffer layer disposed on the substrate and the light shielding member;
a first insulating layer disposed between the gate electrode and the semiconductor member; and
a second insulating layer covering at least a portion of the buffer layer, the semiconductor member, the first insulating layer, and the gate electrode;

wherein at least a portion of the source electrode and at least a portion of the drain electrode are disposed on the second insulating layer, the source electrode is connected to a first contact portion of the semiconductor member through penetrating a first through hole of the second insulating layer, and the drain electrode is connected to a second contact portion of the semiconductor member through penetrating a second through hole of the second insulating layer; and wherein a portion of the source electrode disposed on the second insulating layer comprises a first extension portion, a portion of the drain electrode disposed on the second insulating layer comprises a second extension portion, and both of the first extension portion and the second extension portion are configured to block external light that is emitted from an outside of the thin film transistor array substrate to an electron migration channel of the thin film transistor;

wherein when both of the source electrode and the drain electrode are made of a light-permeable metal, a first light shielding sheet made of an opaque metal is disposed at a position on the second insulating layer and corresponding to the first extension portion, and a second light shielding sheet made of an opaque metal is disposed at a position on the second insulating layer and corresponding to the first extension portion.

12. The display panel according to claim 11, wherein the first extension portion extends from a body of the source electrode toward the drain electrode.

13. The display panel according to claim 11, wherein a first projection of the first extension portion projected on a plane where the thin film transistor array substrate is located overlaps a second projection projected on a plane, where the thin film transistor array substrate is located, of a first gap between the body of the source electrode and the gate electrode.

14. The display panel according to claim 11, wherein the second extension portion extends from a body of the drain electrode toward the source electrode.

15. The display panel according to claim 11, wherein a third projection of the second extension portion projected on a plane where the thin film transistor array substrate is located overlaps a fourth projection projected on a plane, where the thin film transistor array substrate is located, of a second gap between the body of the drain electrode and the gate electrode.

16. The display panel according to claim 11, wherein both of the first extension portion and the second extension portion are made of opaque metal.

17. The display panel according to claim 11, wherein the first light shielding sheet is disposed between the first extension portion and the second insulating layer, or the first light shielding sheet is disposed on a surface of the first extension portion facing away from the second insulating layer; and the second light shielding sheet is disposed between the second extension portion and the second insulating layer, or the second light shielding sheet is disposed on a surface of the second extension portion facing away from the second insulating layer.

18. The display panel according to claim 11, wherein both of the first light shielding sheet and the second light shielding sheet are configured to block external light that is emitted from the outside of the thin film transistor array substrate to the electron migration channel of the thin film transistor.

\* \* \* \* \*

UNITED STATES PATENT AND TRADEMARK OFFICE
CERTIFICATE OF CORRECTION

PATENT NO. : 10,546,881 B2
APPLICATION NO. : 16/086017
DATED : January 28, 2020
INVENTOR(S) : Yingchun Fan et al.

Page 1 of 1

It is certified that error appears in the above-identified patent and that said Letters Patent is hereby corrected as shown below:

On the Title Page

Insert the following:
-- (30) *Foreign Application Priority Data*
Apr. 19, 2018 (CN)..................... 201810356275.7 --

Signed and Sealed this
Twenty-eighth Day of July, 2020

Andrei Iancu
*Director of the United States Patent and Trademark Office*